United States Patent

Jha

[11] Patent Number: 6,134,686
[45] Date of Patent: Oct. 17, 2000

[54] TECHNIQUE TO DETECT DRIVE STRENGTH OF INPUT PIN

[75] Inventor: Kaushal Kumar Jha, Bangalore, India

[73] Assignee: Cypress Semiconductor Corp., San Jose, Calif.

[21] Appl. No.: 09/086,870

[22] Filed: May 29, 1998

[51] Int. Cl.[7] .................................................. G01R 31/28
[52] U.S. Cl. ............................................................ 714/724
[58] Field of Search ..................................... 714/724, 745, 714/721, 738; 326/98; 324/76.11, 158.1; 327/143

[56] References Cited

U.S. PATENT DOCUMENTS

| | | | |
|---|---|---|---|
| 5,077,521 | 12/1991 | Langford, II et al. | 324/158.1 |
| 5,198,707 | 3/1993 | Nicolai | 307/475 |
| 5,491,794 | 2/1996 | Wu | 714/23 |
| 5,942,925 | 8/1999 | Stahl | 327/143 |

FOREIGN PATENT DOCUMENTS 4-98173  3/1992  Japan ..................................... 714/724

*Primary Examiner*—Hoa Nguyen
*Attorney, Agent, or Firm*—Christopher P. Maiorana, P.C.

[57] ABSTRACT

A method and apparatus comprising (i) a first circuit that may be configured to generate a first and second pulse in response to a reset signal, (ii) a latch circuit that may be configured to generate a first and second latch output in response to (a) the first and second pulses, (b) the reset signal and (c) an input signal and (iii) a third circuit that may be configured to generate a detect output in response to the first and second latch outputs. The detect output may be implemented as a trigger signal having an enabled state indicating a floating voltage is present on the input signal. The first and second latch outputs may be used to indicate the drive strength of the input signal. The enabled state of the detect output may have a floating state other than a standard logic "1" or logic "0".

16 Claims, 3 Drawing Sheets

5,134,686

TECHNIQUE TO DETECT DRIVE STRENGTH OF INPUT PIN

FIELD OF THE INVENTION

The present invention relates to integrated circuits generally and, more particularly, to an input pin on an integrated circuit that detects a drive strength during a power-on condition.

BACKGROUND OF THE INVENTION

Conventional approaches to implementing digital logic on an integrated circuit provide an input pin that detects either a HIGH (e.g., a "1") or a LOW (e.g., a "0") state. A number of such pins are implemented to perform various operations, such as I/O or addressing.

It may be desirable to use a pin dedicated to trigger a specific event in the integrated circuit. One such event would be to enter a test mode where such a dedicated input pin is used to trigger the test mode. With such an arrangement, the dedicated pin generally does not perform other functions, such as I/O or addressing. Since it is generally desirable to reduce the overall number of pins on an integrated circuit, this solution may not be desirable in certain design applications, such as high pin count devices.

SUMMARY OF THE INVENTION

The present invention concerns a method and apparatus comprising (i) a first circuit that may be configured to generate a first and second pulse in response to a reset signal, (ii) a latch circuit that may be configured to generate a first and second latch output in response to (a) the first and second pulses, (b) the reset signal and (c) an input signal and (iii) a third circuit that may be configured to generate a detect output in response to the first and second latch outputs. The detect output may be implemented as a trigger signal having an enabled state indicating a floating voltage is present on the input signal. The first and second latch outputs may be used to indicate the drive strength of the input signal. The enabled state of the detect output may have a floating state other than a standard logic "1" or logic "0".

The objects, features and advantages of the present invention include providing a method and apparatus that may (i) detect the drive strength of an input signal, (ii) detect a floating voltage, and (iii) reduce the number of pins required on an integrated circuit. The circuit and method may present an output in response to the floating voltage that may be used to enter a test mode or other alternate operating condition.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
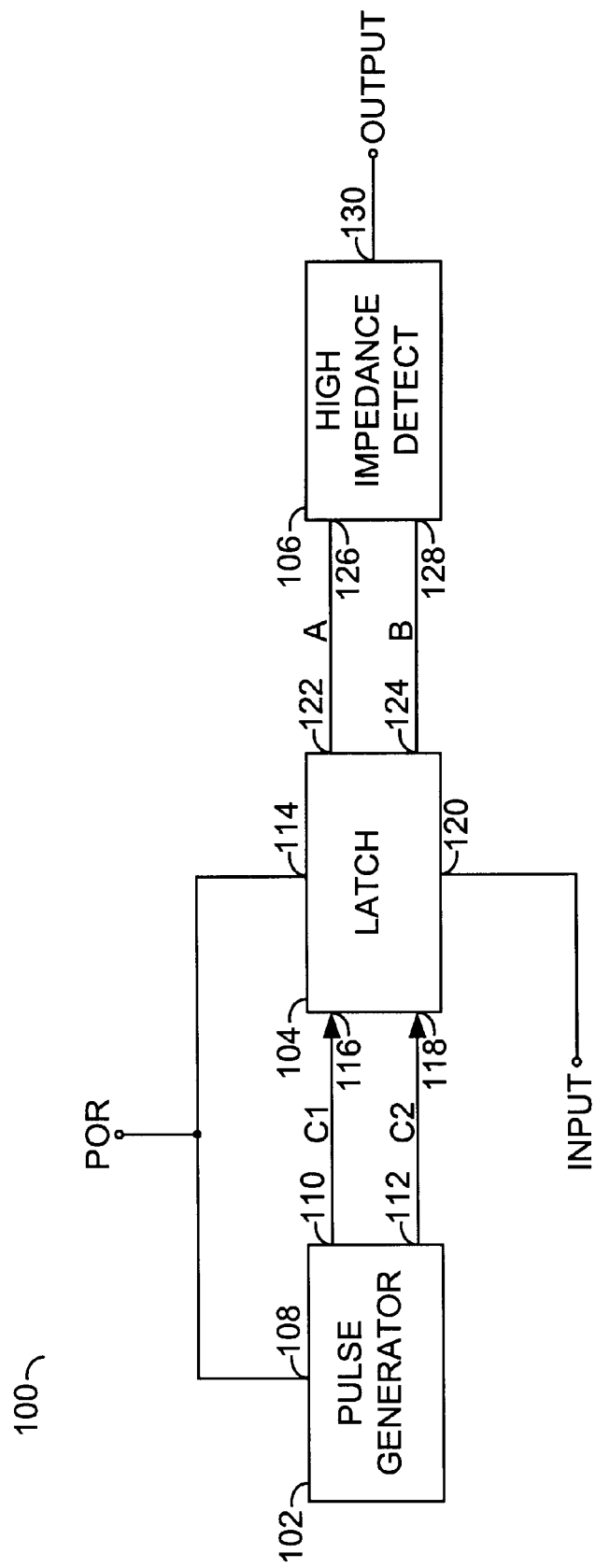
FIG. 1 is a block diagram of a preferred embodiment of the present invention.

Referring to FIG. 1, a block diagram of a circuit 100 is shown in accordance with a preferred embodiment of the present invention. The circuit 100 generally comprises a pulse generator block (or circuit) 102, a latch block (or circuit) 104 and a high impedance detect block (or circuit) 106. The pulse generator block 102 has an input 108 that may receive a reset signal (e.g., a power on reset signal POR), an output 110 and an output 112. The output 110 may present a first pulse signal (e.g., signal C1) and the output 112 may present a second pulse signal (e.g., signal C2).

The latch block 104 has an input 114 that may receive the signal POR, an input 116 that may receive the signal C1, an input 118 that may receive the signal C2 and an input 120 that may receive a signal (e.g., INPUT) from an input pin. The input pin may be a pin that may be used to provide an I/O function (or other function) to an integrated circuit. The latch block 104 also comprises an output 122 that may present a first signal (e.g., a signal A) and an output 124 that may present a second signal (e.g., a signal B). The high impedance detect block 106 comprises an input 126 that may receive the signal A and an input 128 that may receive the signal B. The high impedance detect block 106 has an output 130 that presents a signal (e.g., OUTPUT) when an active signal is received at one of the inputs 126 or 128 (to be described in more detail in connection with FIG. 3). The high impedance detect block 106 generally provides an XOR (i.e., an exclusive OR) logic function of the signals received at the inputs 126 and 128. However, other logic functions may be implemented that provide a similar logic function (e.g., a NAND gate with the complement of the signals A and B).

Figure 2:
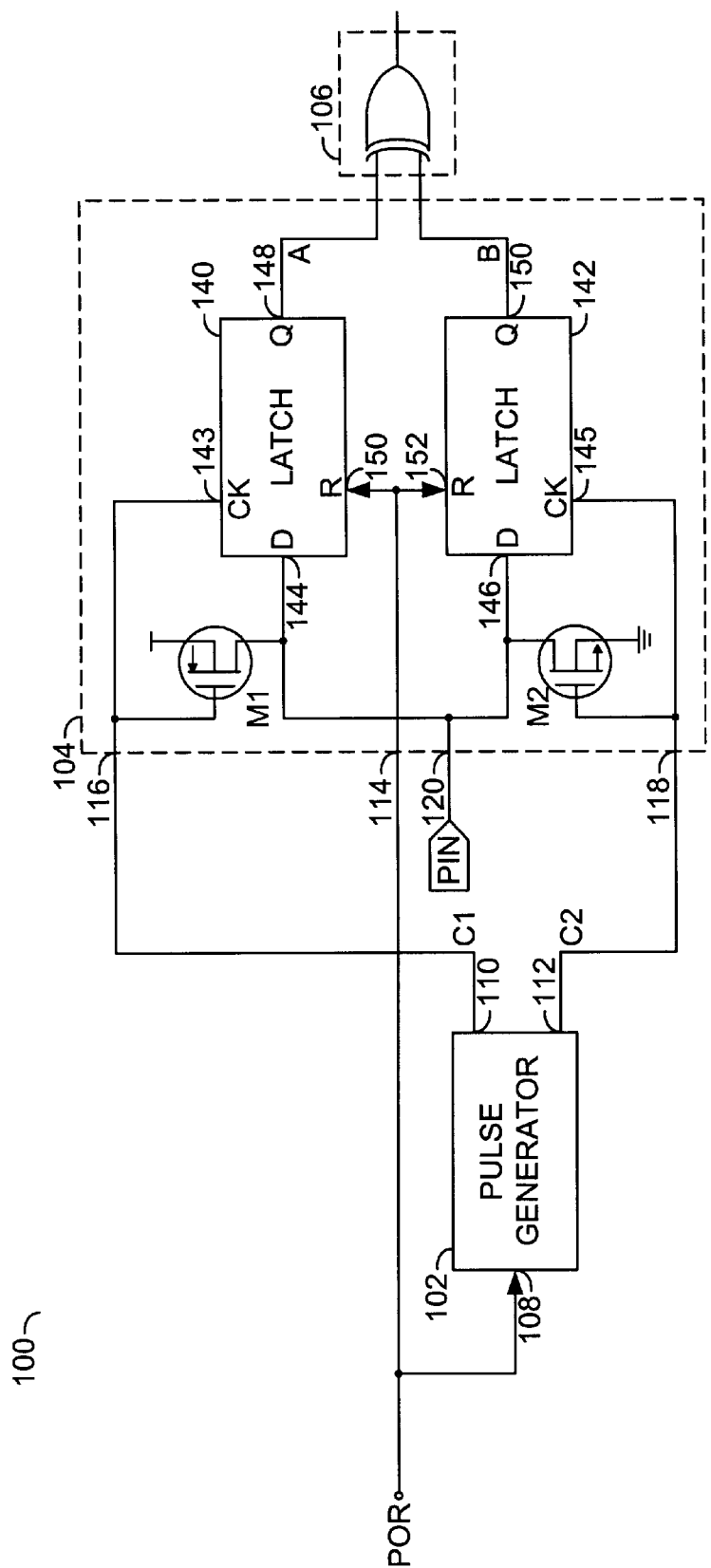
FIG. 2 is a more detailed block diagram of a preferred embodiment of the present invention.

Referring to FIG. 2, the circuit 100 is shown in greater detail. Specifically, the latch block 104 further comprises a transistor M1, a transistor M2, a latch 140 and a latch 142. In one example, the transistors M1 and M2 may be implemented as weak transistors, to be described in more detail in connection with equations EQ1 and EQ2. The transistor M1 has a gate that may receive the signal C1 from the input 116. The signal C1 may also be presented to an input 143 of the latch 140. The transistor M1 also has a source that may be coupled to an input supply voltage (e.g., VCC) and a drain that may be connected to an input 144 of the latch 140. The input 144 and the drain of the transistor M1 may also be coupled to the input 120. The transistor M2 has a gate that may receive the signal C2 received at the input 118. The gate may also be coupled to an input 145 of the latch 142. A drain of the transistor M2 may be coupled to ground. The source of the transistor M2 may be coupled to the input 120 as well as to an input 146 of the latch 142. The latch 140 has an output 148 that may present the signal A. The latch 142 has an output 150 that may present the signal B. The signals A and B are generally presented to the high impedance detect circuit 106. The latch 140 also has an input 150 that may receive the power on reset signal POR. The latch 142 has a similar input 152 that may receive the signal POR. The inputs 143 and 145 may operate as clock inputs to the latches 140 and 142, respectively.

Figure 3:
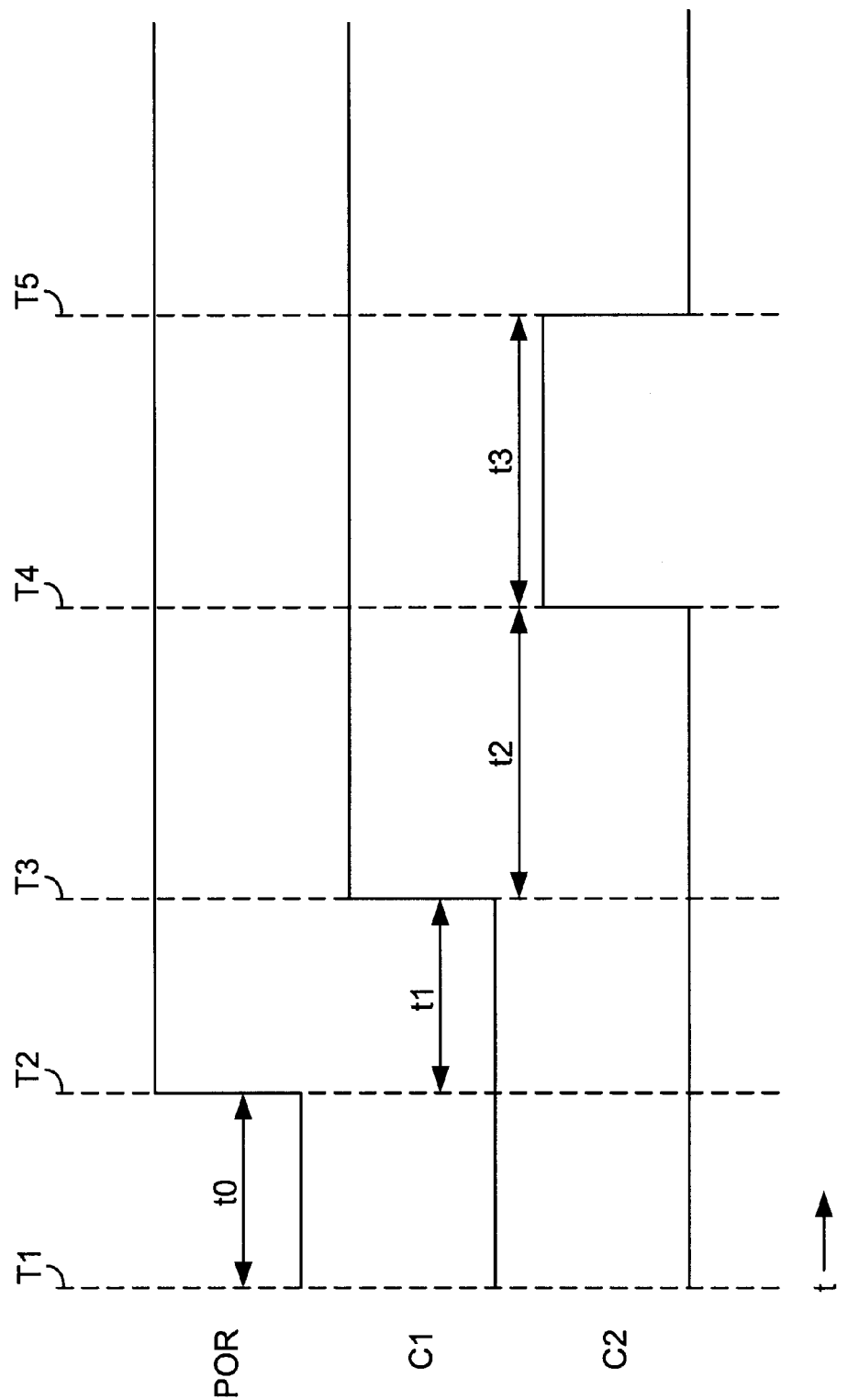
FIG. 3 is a timing diagram illustrating the outputs of circuits of FIGS. 1 and 2.

Referring to FIG. 3, a timing diagram of the various signals of the circuit 100 is shown where the x-axis generally represents time. A number of times T1, T2, T3, T4 and T5 are shown representing various transition points of the signals POR, C1 and C2. The signal POR is shown having a positive transition at the time T2. The signal C1 generally has a positive transition at the time T3. The time between the time T1 and the time T2 generally represents a time window t0. The signal C1 generally has a positive transition at the time T3. The time between the time T2 and the time T3 generally represents a time window t1. The signal C2 generally has a positive transition at the time T4. The time between the time T3 and the time T4 generally represents a time window t2. The signal C2 generally has a negative transition at the time T5. The time between the time T4 and the time T5 generally represents a time window t3. The positive transition of the signal C1 generally occurs at a fixed time, represented by the time window t1, after the positive transition of the signal POR. The signal C2 generally has a positive transition at a fixed time, generally equal to the time window t1 plus the time window t2, after the positive transition of the signal POR. The time windows t1, t2 and t3 may be individually adjusted in order to meet the design criteria of a particular application.

The signal POR may be used to initialize the latches 140 and 142. The pulse generator 102 generates the signals C1 and C2 in response to the signal POR, as defined by the time windows t1 and t2. If the signal at the input 120 is driven HIGH or LOW, then the signal A and the signal B may take on the same logic values at the end of the time windows t1 and t3, respectively. However, if the input 120 is floating, then the signal A may be at a logic HIGH level at the end of the time window t1 and the signal B may be at a logic LOW at the end of the time window t3. Since the high impedance detect circuit 106 is generally implemented as an XOR logic, an output of "1" generally indicates a high impedance state is present at the input 120. An output of "0" from the circuit 106 generally indicates a logic level of "0" or "1" present at the input 120. However, the logic level of the output of the high impedance detect circuit 106 may be adjusted to act as a negative polarity output where an output of "0" may indicate a high impedance state at the input 120 and an output of "1" may indicate a normal driven logic level at the input 120. When the signal at the input 120 is being driven by an outside source, the state of the input signal may be determined by the outside source since the transistors M1 and M2 may be implemented as weak pull-up and pull-down devices. However, when there is no outside source driving the input 120 (e.g., the input is "floating"), the state of the input is determined by the transistors M1 and M2.

Referring back to FIG. 2, the size of the transistor M1 and the transistor M2 may be determined by the maximum current that the input pin can source/sink. For example, the size (e.g., the ratio of the width to the length) of the P-channel transistor may be defined by the following EQ1:

$$(W/l)_P = \{2I_{IL}/\mu_P \, Cox(Vdd-|V_{tp}|)2\} \quad \text{EQ1}$$

where $^1 1L$ = maximum input load current at VI=OV
$\mu$p = mobility of the p-carrier
Cox = gate oxide
Vdd = power supply voltage
$V_{tP}$ = P-channel transistor threshold voltage
VI = voltage at the input pin The size of the N-channel transistor may be defined by the following EQ2:

$$(w/l)_N = \{2I^{IM}/\mu_n \, Cox \, (Vdd-|V_{tL}|)2\} \quad \text{EQ2}$$

where $I_{IM}$ = maximum input load current at VI=Vdd
$\mu_n$ = mobility of the n-carrier
$V_{TN}$ = N-channel transistor threshold voltage The equations EQ1 and EQ2 are illustrative examples of the parameters for sizing the transistors M1 and M2. Other parameters may be implemented accordingly to meet the design criteria of a particular application.

The width of the pulses t1 and t3 may also be adjusted accordingly to meet the design criteria of a particular application. The pulse t1 may be defined by the following equation EEQ3:

$$t1 >/= (4C_{IN}*Vdd)/I_{IH} \quad \text{EQ3}$$

where $C_{IN}$ defines the input capacitance.

The pulse width t3 may be defined by the following equation EQ4:

$$t3 >/= (4C_{IN}*Vdd)/I_{IL}. \quad \text{EQ4}$$

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a first circuit configured to generate a first pulse and a second pulse in response to a reset signal;
   a second circuit configured to generate a first latch output and a second latch output in response to (i) said first and second pulses, (ii) said reset signal and (iii) an input signal; and
   a third circuit configured to generate a detect output in response to said first and second latch outputs, wherein said detect output is at an enabled state indicating a floating state is present on said input signal when only one of said first and second latch outputs is at an enabled state.

2. The circuit according to claim 1, wherein said input signal has a first state, a second state or said floating state.

3. The circuit according to claim 1, wherein said first and second pulses are generated in response to a transition of said reset signal.

4. The circuit according to claim 1, wherein said first pulse remains at a first state for a first time window and said second pulse remains at said first state for a second time window.

5. The circuit according to claim 4, wherein the first and second time windows are independently variable.

6. The circuit according to claim 5, wherein said first circuit further comprises a first and second transistor and a first and second latch.

7. The circuit according to claim 6, wherein said first and second time windows are independently variable.

8. The circuit according to claim 7, wherein one of said first and second transistors is a p-channel transistor and one of said first and second transistors is a n-channel transistor.

9. A circuit comprising:
   means for generating a first pulse and a second pulse in response to a reset signal;
   means for generating a first latch output and a second latch output in response to (i) said first and second pulses, (ii) said reset signal and (iii) an input signal; and
   means for generating a detect output in response to said first and second latch outputs, wherein said detect output is at an enabled state indicating a floating state is present on said input signal when only one of said first and second latch outputs is at an enabled state.

10. A method for detecting drive strength on an input pin comprising the steps of:
   (A) generating a first pulse and a second pulse in response to a reset signal;
   (B) generating a first latch output and a second latch output in response to (i) said first and second pulses, (ii) said reset signal and (iii) an input signal; and
   (C) generating a detect output in response to said first and second latch outputs, wherein said detect output is at an enabled state indicating a floating state is present on said input signal when only one of said first and second latch outputs is at an enabled state.

11. The method according to claim 10, wherein said input signal has a first state, a second state or said floating state.

12. The method according to claim 10, wherein step (A) generates said first and second pulses in response to a transition of said reset signal.

13. The method according to claim 10, wherein said first pulse remains at a first state for a first time window and said second pulse remains at said first state for a second time window.

14. The method according to claim 13, further comprising the step of independently varying said first and second time windows.

15. The method according to claim 14, wherein said first and second time windows are independently variable.

16. The method according to claim 15, wherein one of said first and second transistors is a p-channel transistor and one of said first and second transistors is a n-channel transistor.

* * * * *